(12) United States Patent
Lim et al.

(10) Patent No.: US 7,862,659 B2
(45) Date of Patent: Jan. 4, 2011

(54) SEMICONDUCTOR MANUFACTURING DEVICE

(75) Inventors: You-Dong Lim, Gyeonggi-do (KR); Jae-Ho Byun, Gyeonggi-do (KR)

(73) Assignee: TTS Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/137,693

(22) Filed: Jun. 12, 2008

(65) Prior Publication Data
US 2009/0013933 A1    Jan. 15, 2009

(30) Foreign Application Priority Data
Jun. 29, 2007    (KR) ...................... 10-2007-0065205

(51) Int. Cl.
| | |
|---|---|
| C23C 16/00 | (2006.01) |
| C23F 1/00 | (2006.01) |
| H01L 21/306 | (2006.01) |
| H01L 21/683 | (2006.01) |
| H01T 23/00 | (2006.01) |

(52) U.S. Cl. ........................ 118/728; 118/715; 118/724; 118/725; 156/345.37; 156/345.51; 156/345.52; 156/345.53; 361/234

(58) Field of Classification Search ................. 118/715, 118/725, 728; 156/345.51, 345.52; 219/61.7, 219/67, 76.16, 76.17
See application file for complete search history.

(56) References Cited

U.S. PATENT DOCUMENTS

| | | | |
|---|---|---|---|
| 2002/0195438 A1* | 12/2002 | Babikian | ..................... 219/390 |
| 2005/0229854 A1* | 10/2005 | Moroz | ......................... 118/725 |
| 2008/0083732 A1* | 4/2008 | Shinma et al. | ........... 219/444.1 |

* cited by examiner

*Primary Examiner*—Parviz Hassanzadeh
*Assistant Examiner*—Rakesh Dhingra
(74) *Attorney, Agent, or Firm*—Porzio, Bromberg & Newman, P.C.

(57) ABSTRACT

The present invention relates to a semiconductor manufacturing device that a maintenance or a repairing is easy so that an efficiency of manufacturing can be enhanced because a high temperature of a susceptor can be rapidly down. The present invention relates to a semiconductor manufacturing device that an efficiency of manufacturing can be enhanced because a heater for heating the semiconductor is heated by an external heating device.

3 Claims, 6 Drawing Sheets

SEMICONDUCTOR MANUFACTURING DEVICE

FIELD OF THE INVENTION

The present invention relates to a semiconductor manufacturing device, and more particularly to a semiconductor manufacturing device that a maintenance or a repairing is easy so that an efficiency of manufacturing can be enhanced because a high temperature of a susceptor can be rapidly down.

The present invention relates to a semiconductor manufacturing device that an efficiency of manufacturing can be enhanced because a heater for heating the semiconductor is heated by an external heating device.

BACKGROUND OF THE INVENTION

A susceptor including a semiconductor manufacturing device is a device that is heated by a heater so that a Liquid Crystal Display can maintain a predetermined temperature, which is used a process for LCD CVD.

Recently the LCD panel becomes large its size, and accordingly the size of LCD susceptor extends to over 2 meter. Therefore, to easily execute a maintenance and repairing of an equipment it is necessary to rapidly down a temperature of the susceptor.

Recently, it takes 8 hours in the susceptor for 5 generation, 12 hours in the susceptor for 6 generation, 18 hours for 7 generation, respectively if the susceptor is needed to down to 100° C. from 325° C. Therefore, the larger the size of the LCD panel the more the time for lowing the temperature That the temperature of the susceptor can not be rapidly down causes to down a productivity and to up a cost because a maintenance or a repairing is difficulty. Furthermore, a metal heater for heating a semiconductor during a process for manufacturing the semiconductor has a problem that a surface is corrosived by a fluoric ion of a gas using to a in-situ cleaning process at the high temperature (step for cleaning an equipment used a predetermined period and a method for decreasing a time for cleaning). Furthermore, when an aluminum Nitride heater is used a thermal-shock is very strong, and accordingly it can be broken during a process or while a temperature is up or down.

Furthermore, a cost can be raised because the ALN heater is very expensive.

The above problems cause to occur foreign materials during a process for manufacturing semiconductor at the high temperature because it is impossible to apply in-situ CLN (cleaning) method. Further, a productivity is deteriorated because a chamber and a heater is directly applied in-situ CLN thereby causing loss of time.

To solve the above problems it is proposed that a ALN heater is used instead of the metal heater, however, a cost is raised because it is very expensive and its life can be shorten.

SUMMARY OF THE INVENTION

The present invention has been invented to overcome the above problems it is an object of the present invention is that a temperature of a susceptor using at a process of LCD CVD can be rapidly down so that a productivity can be enhanced and a cost can be down.

It is another object of the present invention is that a heater for heating semiconductor is heated by an external heating member so that a productivity can be enhanced.

To accomplish the above objects the present invention provides a semiconductor manufacturing device comprising: a susceptor body; a circular-typed cooling pipe for circulating a cooling air having an inlet for supplying a cooling air from an external supplying device to a susceptor body and an outlet for discharging the cooling air that circulated in the overall susceptor body from the inlet; and a heater for heating the body for keeping the temperature of the LCD, wherein said heater is disposed at the lowest portion of the body not to be contacted to the cooling pipe by a first cover, wherein said cooling pipe is disposed at the upper portion of the first cover for covering the heater and disposed to be complied to the position of the heater, wherein said cooling pipe is disposed to be covered by a second cover, wherein said second cover is disposed with a third cover thereon for preventing the temperature of the cooling air circulating in the cooling pipe to be rapidly went up by the operation of the heater.

The cooling pipe is made of copper (Cu) or stainless (Sus) that a heat transfer and a corrosion resistance and a heat-resisting property are good and there is no magnetism property because it is disposed in the body of the susceptor and the heater is disposed therebelow.

The cooling pipe is not limited its outer shape and road for flowing cooling air, and wherein the cooling air is one of the materials of a harmless gas, He, PCW (Process Cooling Air) and Galden.

The susceptor comprises without the cooling pipe so that the cooling air is directly circulated in the second cover.

To accomplish the above objects the present invention provides a semiconductor manufacturing device comprising: a shower head for supplying a gas for manufacturing a semiconductor; a process chamber for executing the process for manufacturing the semiconductor using the gas from the shower head; a vacuum line for serving to extrude the gas occurred during the process for manufacturing the semiconductor; a dry pump for pumping an air for depositing a film to the semiconductor (PE-CVD process) in the process chamber; a throttle valve attached at the vacuum line for controlling pressure of the air flowing to the vacuum line from the process chamber; an isolation gate valve; a heating member disposed in the process chamber for heating the semiconductor; an external heating member for supplying heating gas to the heating member in the chamber; and a gas supplier for supplying a gas to the external heating member.

The external heating member has a heater for heating the gas supplied from the gas supplier; a temperature controller for controlling the temperature of the gas heating by the heater; and a heating gas flowing line for supplying the heating gas to the heating member.

The gas supplying to the heating member from the external heating member is the inert gas, for example N2, He or air and is heated by the heater in the external heating member and is controlled to have the range of 50° C.~1,200° C. by the temperature controller.

The heating member is made of the material of ALN, Sus, Inconel and Copper.

The heating member has temperature sensing devices at its flowing road.

The heating member is not limited its external shape and road shape.

DETAILED DESCRIPTION OF THE PREFERRED EMBODIMENT

Figure 1:
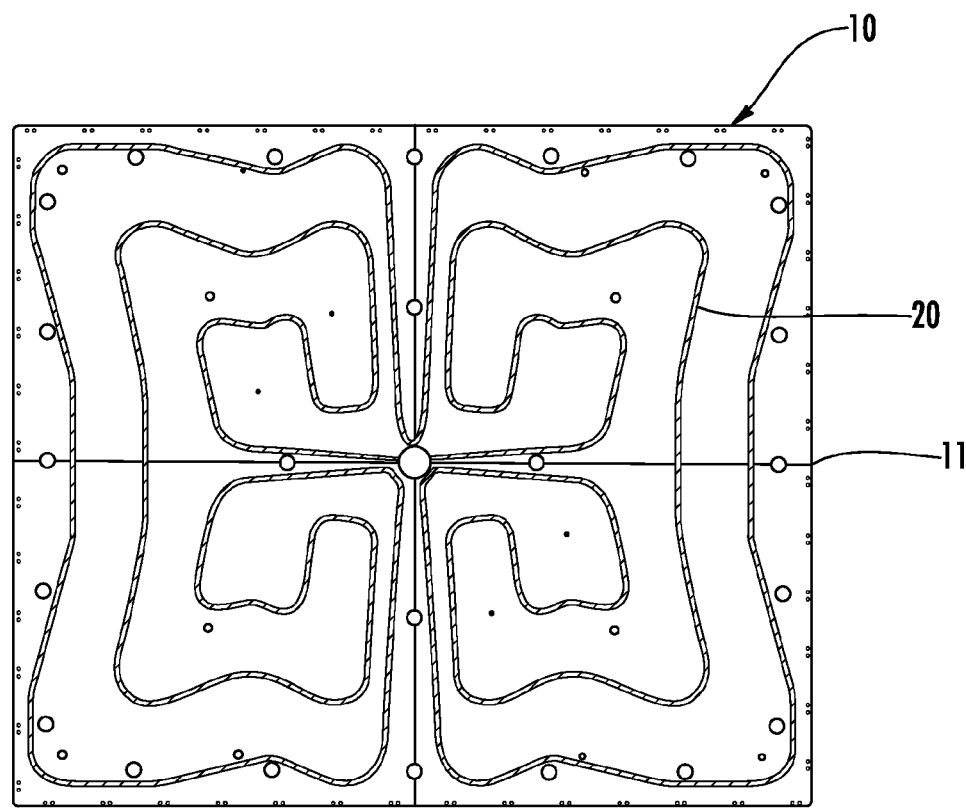
FIG. 1 is a rear view of Liquid Crystal Display for a semiconductor manufacturing device according to a present invention.
Figure 2:
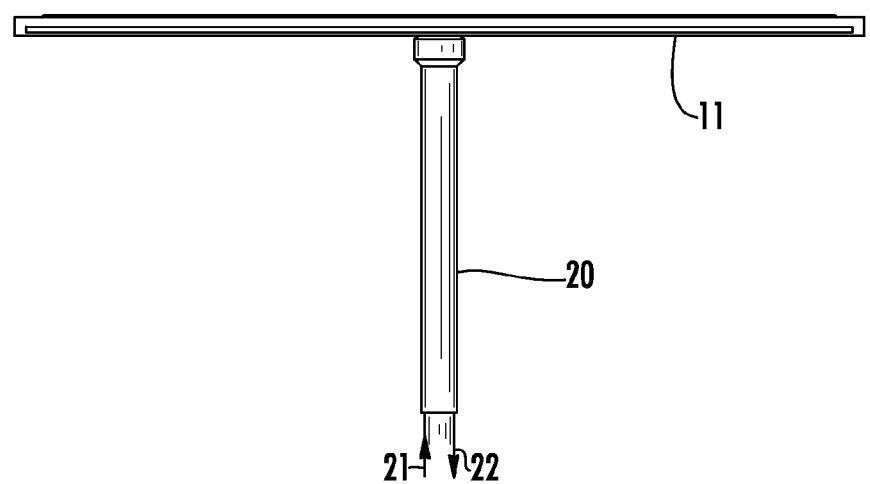
FIG. 2 is a plan view of FIG. 1.
Figure 3:
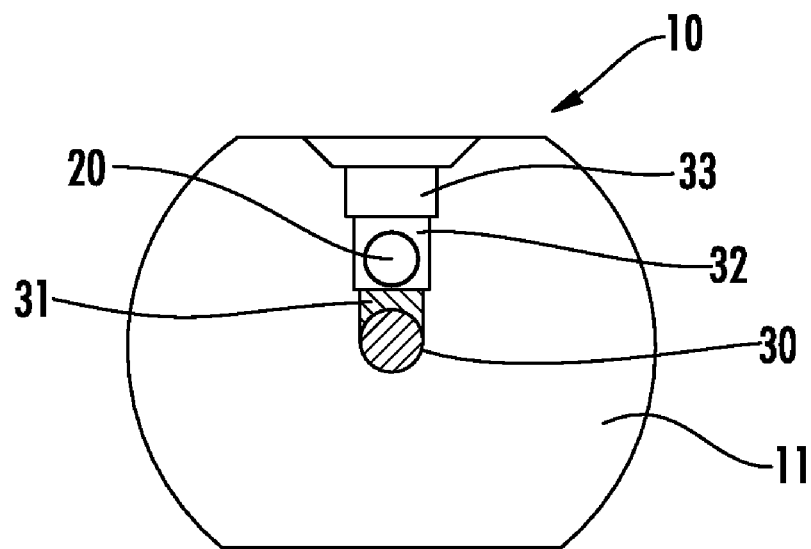
FIG. 3 is a sectional view of FIG. 1.

As shown in FIGS. 1 to 3 a Liquid Crystal Display Susceptor 10 comprises a circular-typed cooling pipe 20 for circulating a cooling air having an inlet 21 for supplying a cooling air from an external supplying device not shown to a susceptor body 11 and an outlet 22 for extruding the cooling air that circulated in the overall susceptor body 11 from the inlet 21 and a heater 30 for heating the body 11 for keeping the temperature of the LCD.

The heater 30 is disposed at the lowest portion of the body 11 not to be contacted to the cooling pipe 20 by a first cover 31. The cooling pipe 20 is disposed at the upper portion of the first cover 31 for covering the heater 30 and disposed to be complied to the position of the heater 30.

The cooling pipe 20 is disposed to be covered by a second cover 32. The second cover 32 is disposed with a third cover 33 thereon for preventing the temperature of the cooling air circulating the cooling pipe 20 to be rapidly increased by the operation of the heater 30.

Figure 4:
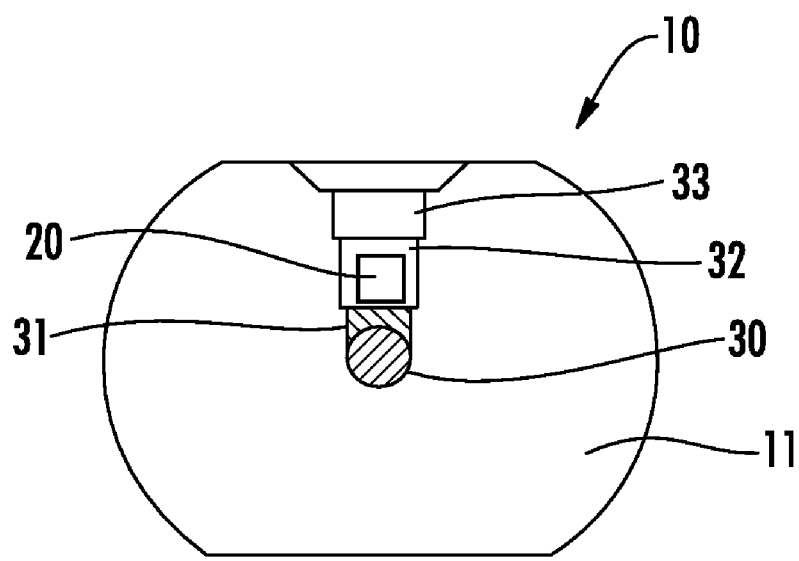
FIG. 4 is a sectional view of LCD susceptor according to another embodiment of the present invention.

The cooling pipe 20 as shown in FIG. 4 is not limited its outer shape and the path for flowing cooling air, for example, circular or square shape and is disposed separated inlet 21 and outlet 22 as pipe shape. In FIG. 4 the square-shaped cooling pipe 20 is shown.

The cooling pipe 20 is made of copper (Cu) or stainless (Sus) that a heat transfer and a corrosion resistance and a heat-resisting property are good and there is no magnetism property because it is disposed in the body 11 of the susceptor 10 and the heater 30 is disposed therebelow.

The present invention having the above construction operates when an abnormal state, for example overheating is occurred while the heater 30 operates to keep the temperature of the LCD and when maintenance or repairing of the equipment is needed after process by being supplied the cooling air through the inlet 21 such as the cooling materials of a harmless gas, He, PCW (Process Cooling Air) and Galden from the outer supplying device.

Therefore, the cooling air circulates in the susceptor 10 by the cooling pipe 20 so that the temperature of the susceptor 10 is down. After circulating for downing the temperature of the susceptor 10 the cooling air is discharged out side through the outlet 22.

The temperature of the cooling air flowing in the cooling pipe 20 is prevented to be rapidly raised because the first cover 31 isolates heat from the heater 30 to the cooling air. The temperature of the cooling air is also prevented to be rapidly raised because the second and third covers 32 and 33 covering the cooling pipe 20 isolate the outside air. Therefore, the temperature of the susceptor 10 can be rapidly down.

The maintenance or repairing of the equipment is executed after the temperature of the susceptor 10 is down by the cooling air flowing in the cooling pipe 20.

Meanwhile, the susceptor 10 of the present invention can be comprised without the cooling pipe 20. In this case the cooling air is directly circulated in the second cover 32. That is, the second cover 32 serves to circulate the cooling air instead of the cooling pipe 20.

Another embodiment of the present invention is in detail described.

Figure 5:
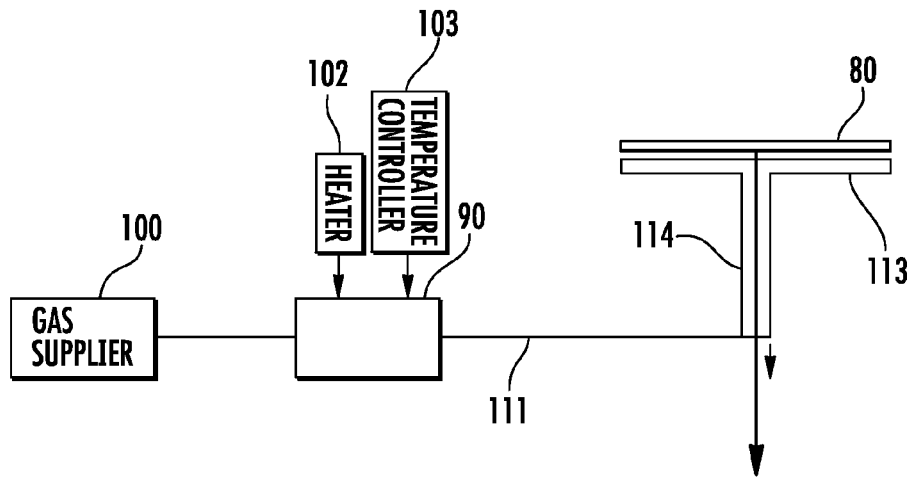
FIG. 5 is a concept view for a heating to a wafer according to other embodiment of the present invention.
Figure 6:
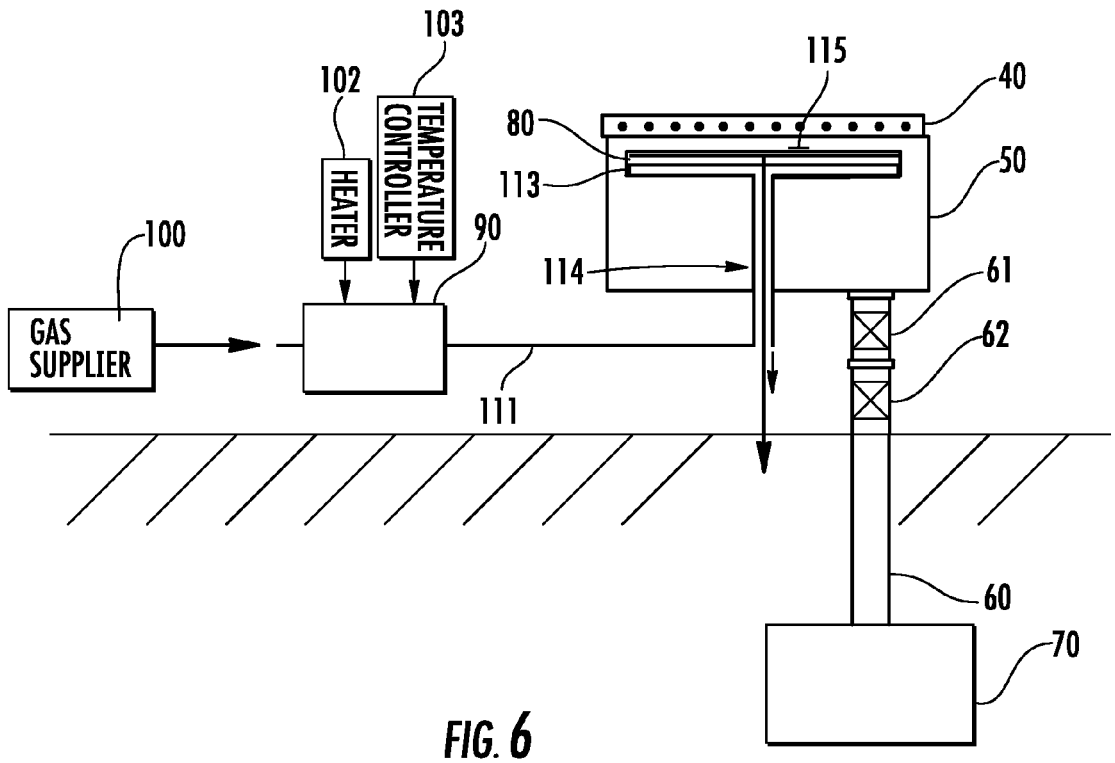
FIG. 6 is a constructional view of FIG. 5.
Figure 7A:
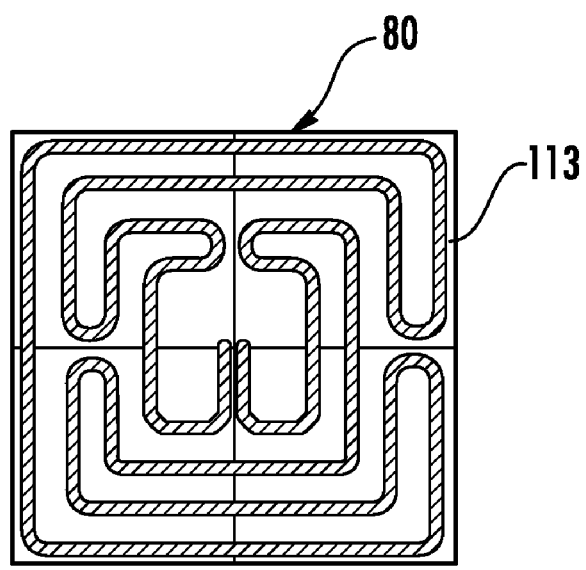
FIGS. 7a to 7f are several constructional views of heating member of FIGS. 5 and 6.
Figure 7B:
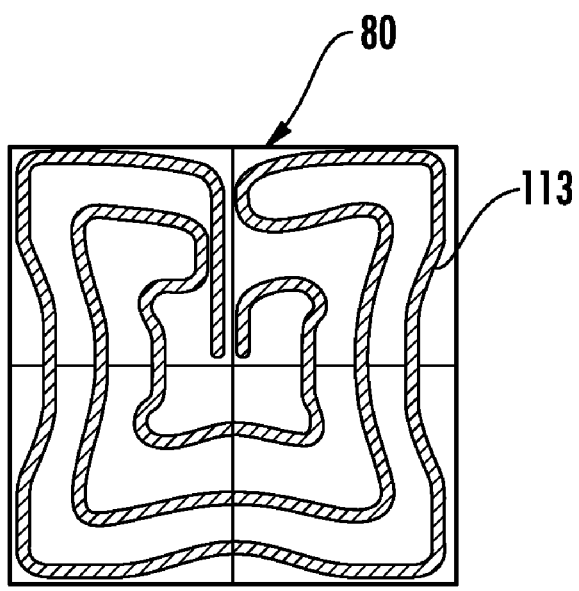
Figure 7C:
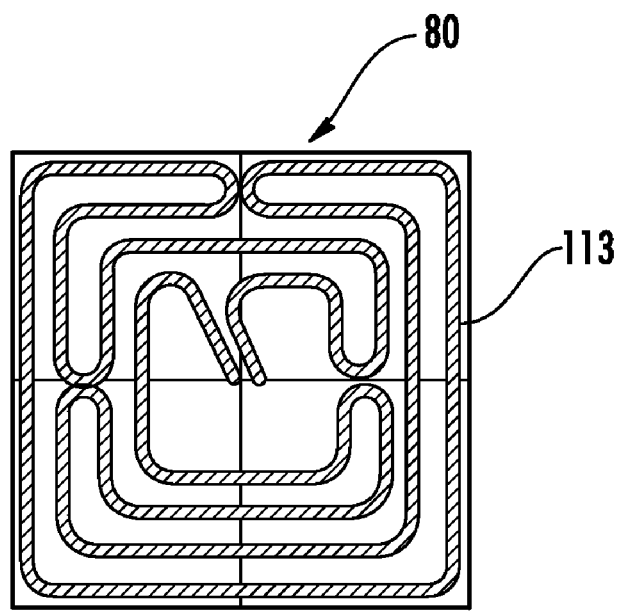
Figure 7D:
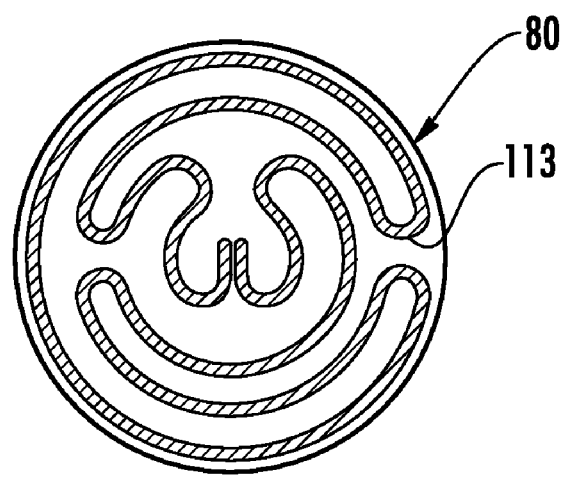
Figure 7E:
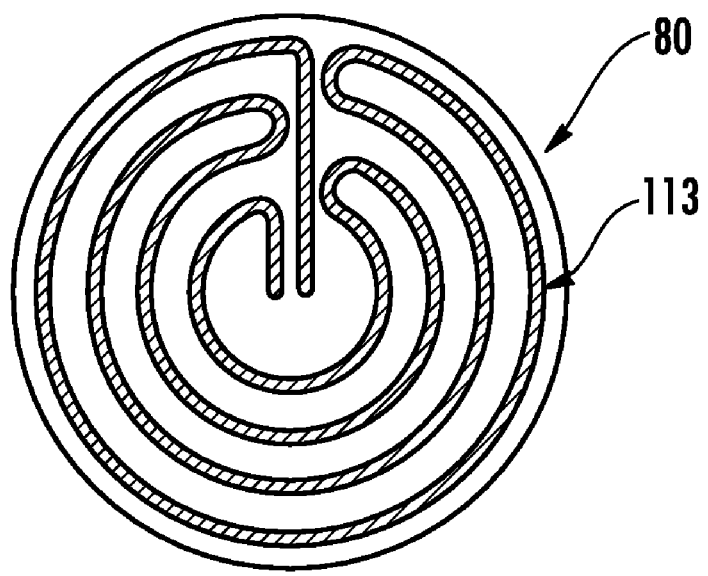
Figure 7F:
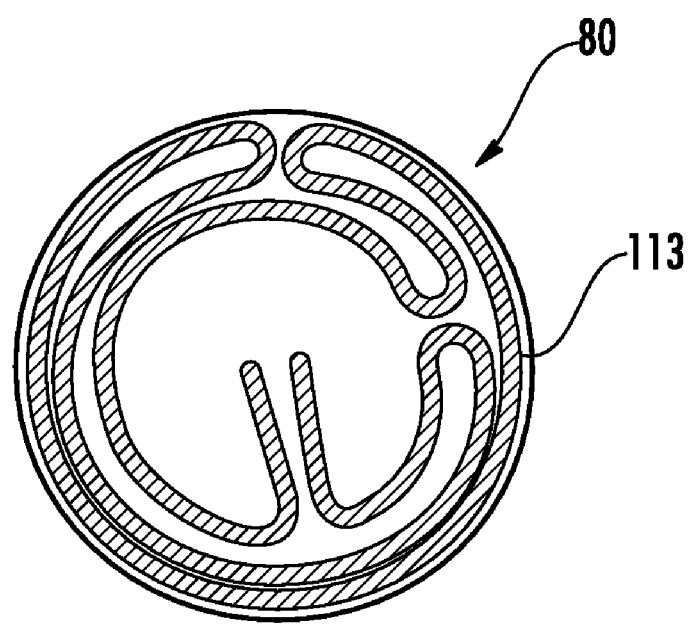

As shown in FIGS. 5 and 6 a semiconductor manufacturing device according to the present invention comprises a shower head 40 for supplying a gas for manufacturing a semiconductor (wafer); a process chamber 50 for executing the process for manufacturing the semiconductor using the gas from the shower head 40; a vacuum line (pipe) 60 for serving to discharge the gas occurred during the process for manufacturing the semiconductor; a dry pump 70 for pumping an air for depositing a film to the semiconductor (PE-CVD process) in the process chamber 50; a throttle valve 61 attached at the vacuum line 60 for controlling pressure of the air flowing to the vacuum line 60 from the process chamber 50; a isolation gate valve 62; a heating member 80 disposed in the process chamber 50 for heating the semiconductor; an external heating member 90 for supplying heating gas to the heating member 80 in the chamber 50; and a gas supplier 100 for supplying a gas to the external heating member 90.

The external heating member 90 has a heater 102 for heating the gas supplied from the gas supplier 100 and a temperature controller 103 for controlling the temperature of the gas heating by the heater 102.

Furthermore, the external heating member 90 has a heating gas flowing line 111 for supplying the heating gas to the heating member 80.

The gas supplying to the heating member 80 from the external heating member 90 is the inert gas, for example N2, He or air and is heated by the heater 102 in the external heating member 90 and is controlled to have the range of 50° C.~1,200° C. by the temperature controller 103.

The heating member 80 is made of the material of ALN and has a heated gas flowing road 113 for circulating and discharging the heating source, such as the heating gas from the external heating member 90.

Further, the heating member 80 has temperature sensing devices 114 and 115 at its flowing road 113 and the heating member 80 for sensing the temperature of the heating member 80 circulating the heated gas. Therefore, the temperature controller 103 controls the temperature of the heating gas heating by the external heating member 90 based on the sensed temperature.

Further, the heating member 80 is made of the materials of Sus, Inconel, Copper etc. Now, an operation of the semiconductor manufacturing device having the above construction according to the present invention will be explained.

A process for manufacturing semiconductor is executed while the gas is supplied to the process chamber 50 from the shower head 40. The gas occurred during the process for manufacturing the semiconductor in the chamber 50 is controlled its pressure by the throttle valve 61 and is discharged through the vacuum line 60. The film is deposited on the semiconductor manufactured in the chamber 50 by pumping of the pump 70. That is, the process for PE-CVD is executed to the semiconductor.

At this time the heated gas supplied through the line 11 from the external heating member 90 is circulated (flowed) in the road 113 of the heating member 80 so that the semiconductor is heated. The heated gas circulated in the road 113 is discharged outside.

Meanwhile, as shown in FIGS. 7a to 7f the heating member 80 is not limited its shape, for example a circular or a square shape. However, the shape of the heating member 80 should be designed based on a temperature or a stay time of the heated gas supplied from the external heating member 90 so that a heating temperature is constant.

That is, the road 113 has a various shapes to be maintained a certain temperature based on that the temperature to the semiconductor is not equal according to the process.

The present invention has advantages as follows.

First, a maintenance or a repairing is easy because the temperature of the susceptor can be rapidly down by the cooling air flowing in the cooling pipe.

Second, a cost can be down and a productivity can be enhanced because maintenance or repairing of an equipment is easy.

Third, a productivity can be enhanced because a heater made of Aluminum Nitride against Fluorine is heated by an external heating member.

The invention claimed is:

1. A semiconductor manufacturing Liquid Crystal Display (LCD) Susceptor device comprising:
    a susceptor body;
    a circular-type cooling pipe for circulating a cooling air having an inlet for supplying a cooling air from an external supplying device to the susceptor body and an outlet for discharging the cooling air that circulated in the susceptor body from the inlet; and
    a heater for heating the susceptor body for keeping the temperature of the LCD,
    a first cover for covering said heater, wherein said heater cover is formed of a material to isolate heat from said heater to the cooling air in the cooling pipe,
    wherein said heater is disposed at the lowest portion of the body not to be contacted to the cooling pipe by the first cover,
    wherein said cooling pipe is disposed at the upper portion of the first cover and disposed to correspond to the position of the heater,
    wherein said cooling pipe is covered by a second cover and the cooling pipe is completely surrounded by a combination of the first and second covers, wherein said second cover is disposed with a third cover thereon, said second and said third cover isolating the outside air and said first cover, second cover and third cover for preventing the temperature of the cooling air circulating in the cooling pipe to be rapidly increased by the operation of the heater.

2. The device according to claim 1, wherein said cooling pipe is made of one of copper (Cu) or stainless (Sus) and there is no magnetism property because it is disposed in the susceptor body and the heater is disposed therebelow.

3. The device according to claim 1, wherein said cooling pipe is not limited regarding its outer shape, and the path for flowing cooling air, and wherein the cooling air is selected from one of the materials of a harmless gas, He, PCW (Process Cooling Air) and Galden.

* * * * *